(12) United States Patent
Kuratli et al.

(10) Patent No.: US 10,096,561 B2
(45) Date of Patent: Oct. 9, 2018

(54) INTEGRATED CIRCUIT DIE HAVING A SPLIT SOLDER PAD

(71) Applicant: EM Microelectronic-Marin SA, Marin (CH)

(72) Inventors: Christoph Kuratli, Guemmenen (CH); Yves Dupraz, Valeyres-sous-Montagny (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 15/678,201

(22) Filed: Aug. 16, 2017

(65) Prior Publication Data

US 2018/0053738 A1   Feb. 22, 2018

(30) Foreign Application Priority Data

Aug. 17, 2016 (EP) .................................. 16184545

(51) Int. Cl.
*H01L 23/00* (2006.01)
*H01L 23/528* (2006.01)
*H01L 23/31* (2006.01)

(52) U.S. Cl.
CPC .......... *H01L 24/09* (2013.01); *H01L 23/3114* (2013.01); *H01L 23/5286* (2013.01); *H01L 24/17* (2013.01); *H01L 24/48* (2013.01); *H01L 2224/02371* (2013.01)

(58) Field of Classification Search
CPC . H01L 23/3114; H01L 23/5286; H01L 24/17; H01L 24/48
See application file for complete search history.

(56) References Cited

U.S. PATENT DOCUMENTS

| 5,787,098 A | 7/1998 | Dasgupta et al. |
| 5,986,345 A | 11/1999 | Monnot |
| 7,586,199 B1 | 9/2009 | Leistiko et al. |
| 8,405,220 B1 | 3/2013 | Loeb et al. |
| 2003/0045026 A1 | 3/2003 | Fogal et al. |

(Continued)

FOREIGN PATENT DOCUMENTS

| EP | 0 880 171 A2 | 11/1998 |
| JP | 59-193046 | 11/1984 |
| JP | 10-223679 | 8/1998 |

OTHER PUBLICATIONS

European Search Report dated May 10, 2017 in European Application 16184545.8, filed on Aug. 17, 2016.

*Primary Examiner* — Phuc Dang
(74) *Attorney, Agent, or Firm* — Oblon, McClelland, Maier & Neustadt, L.L.P.

(57) ABSTRACT

An integrated circuit die having at least two bond pads, a redistribution layer, the redistribution layer including at least one solder pad including comprising two portions arranged to enable an electrical connection between each other by a same solder ball placed on the solder pad, but electrically isolated of each other in the absence of a solder ball on the solder pad at least two redistribution wires, each one connecting one of the two portions to one of the two bond pads, a first bond pad connected via a first redistribution wire to a first portion of the solder pad being dedicated to digital ground and a second bond pad connected via a second redistribution wire to a second portion of the solder pad being dedicated to analog ground.

9 Claims, 2 Drawing Sheets

(56) References Cited

U.S. PATENT DOCUMENTS

| | | | |
|---|---|---|---|
| 2006/0278955 A1* | 12/2006 | Rissing | H01L 27/14634 257/610 |
| 2008/0258293 A1* | 10/2008 | Yang | H01L 23/3677 257/701 |
| 2009/0080135 A1 | 3/2009 | Major | |
| 2009/0134902 A1 | 5/2009 | Law | |
| 2010/0123226 A1* | 5/2010 | Chen | H01L 23/49503 257/670 |
| 2012/0080806 A1* | 4/2012 | Song | H01L 23/3128 257/777 |
| 2012/0228763 A1 | 9/2012 | Akiyama et al. | |
| 2014/0332811 A1 | 11/2014 | Kumar et al. | |
| 2014/0339704 A1* | 11/2014 | Ahn | H01L 25/0657 257/773 |

* cited by examiner

INTEGRATED CIRCUIT DIE HAVING A SPLIT SOLDER PAD

This application claims priority from European patent application No. 16184545.8 filed Aug. 17, 2016, the entire disclosure of which is hereby incorporated herein by reference.

FIELD OF THE INVENTION

The invention relates to a pad for a solder ball, called solder pad, in a redistribution layer of an integrated circuit die.

BACKGROUND OF THE INVENTION

An integrated circuit (IC) die (also called chip) is classically put into a protective package acting as a mechanical interface between said integrated circuit die and a printed circuit board (PCB). A very large number of different types of package exist, which are basically separated into two main techniques.

In the traditional wire-bond packaging technique, illustrated in FIGS. 1 and 2, an integrated circuit die 10 is placed into a protective package 12 and bond pads 9 of said integrated circuit die 10 are connected to pins 11 of said protective package 12 via tiny bond wires 13. These pins 11 are in turn connected to tracks 14 of a printed circuit board 15.

In the more recent flip-chip technique, illustrated in FIG. 3, the integrated circuit die 10 is directly connected to the printed circuit board 15 via solder balls 16 (or solder bumps). In this technique, solder balls 16 are placed onto solder pads 17 of the integrated circuit die 10. Then, the integrated circuit die 10 is flipped and placed onto the printed circuit board 15, the solder balls establishing electrical connections between the solder pads 17 and the tracks 14. As can be seen in FIG. 4, such an integrated circuit die 10 comprises an extra metal layer, called redistribution layer (RDL). The redistribution layer comprises redistribution wires 18 connecting the solder pads 17 to the input/output bond pads 14 of the integrated circuit die 10. As it is classically practiced, two bond pads 20, 21 are dedicated to the digital ground (VSS) and the analog ground (AVSS). Inconveniently, the digital ground is particularly noisy because of the high frequency content of digital signals.

Thus, in a mixed digital/analog radiofrequency (RF) integrated circuit packaged with the flip-chip technique, in order to keep the noise from transferring from the noisy digital ground to the analog ground while minimizing the number of solder balls used, a same solder pad 19 is connected to both the VSS bond pad 20 and the AVSS bond pad 21 via two RDL wires 22,23. When a solder ball 30 (cf. FIG.5) is placed onto the solder pad 19 and grounded via a printed circuit board track 24, the AVSS bond pad 21 is isolated from the VSS bond pad 20 at high (radio) frequencies, for instance at 2.4 GHz. It is to be noted that the isolation does not work at low frequencies. This is because each wire 22, 23 has an inductance in the order or a few nano-Henry, which is an important value at Giga-Hertz but would be equivalent to a short at low frequencies.

FIG. 5 shows an example of such a case. As it can be seen, the integrated circuit die 10 comprises a bond pad 25 constituting an input for a signal received by an antenna 26. The antenna 26 is electrically connected to a track 27 of the printed circuit board 15, and said track 27 is electrically connected to the antenna input 25 via a solder ball 28. A low-noise amplifier (LNA) 29 is included on the integrated circuit die 10, so as to amplify the antenna signal. More specifically, a positive terminal of the LNA 29 is connected to the antenna bond pad 25, and a negative terminal of the LNA 29 is connected to the AVSS bond pad 21. Thanks to the isolation of the AVSS bond pad 21 from the VSS bond pad 20 (chip-grounded) via the solder ball 30, only the antenna signal is amplified by the LNA 29, not the noise from the digital ground.

To serve a multitude of applications, integrated circuits may be designed for both flip-chip and wire-bond packaging techniques. However, using the integrated circuit die of FIG.4 with a wire-bond package may be problematic. For instance, FIG.6 shows the integrated circuit die 10 of FIG.5 packaged with a wire-bond technique. In this case, noise isolation is performed via two bond-wires 31, 32 that connect the AVSS bond pad 21 and the VSS bond pad 20 to the track 27 (grounded) of the printed circuit board 15. It is inconvenient that this isolation is degraded by the RDL wires 22, 23 that connect the VSS bond pad 20 and the AVSS bond pad 21, since noise may be transmitted from the VSS bond pad 20 to the AVSS bond pad 21 through these RDL wires 22, 23.

SUMMARY OF THE INVENTION

Therefore, it is challenging to offer an integrated circuit die that may be used with both flip-chip and wire-bond packaging techniques while saving solder balls and enabling a good noise isolation between the AVSS and the VSS bond pads.

Hence, the invention relates to an integrated circuit die as defined in claim 1.

If the VSS bond pad is connected to the first portion, and the AVSS bond pad is connected to the second portion, the VSS bond pad and the AVSS bond pad are only in electrical contact with each other when a solder ball is placed onto the solder pad. As a result, with a traditional wire-bond package, there is no risk to transmit noise from the VSS to the AVSS bond pad.

In an embodiment, the solder pad is made of two demi-disks.

The invention also relates to an electronic system as defined in claim 3.

The invention also relates to an electronic system as defined in claim 4.

BRIEF DESCRIPTION OF THE DRAWINGS

Other features and advantages of the present invention will appear more clearly upon reading the following detailed description, made with reference to the annexed drawings given by way of non-limiting examples.

DETAILED DESCRIPTION OF THE PREFERRED EMBODIMENTS

Figure 1:
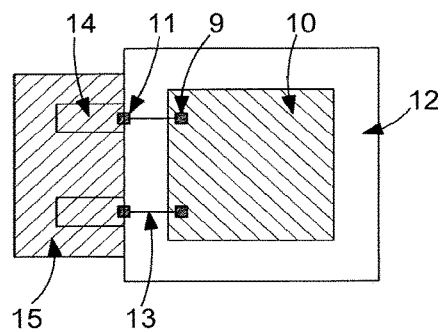
FIG. 1 schematically illustrates a top view of a classical wire-bond package
Figure 2:
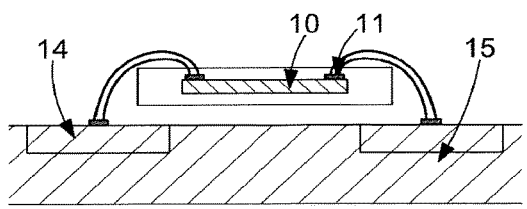
FIG. 2 schematically illustrates a side view of the package of FIG. 1
Figure 3:
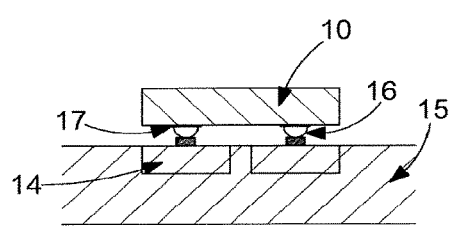
FIG. 3 schematically illustrates a side view of a classical flip-chip package
Figure 4:
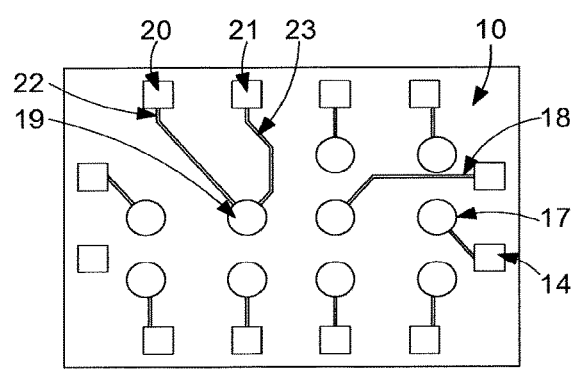
FIG. 4 schematically illustrates an integrated circuit die according to the state of the art FIG. 5 schematically illustrates the integrated circuit die of FIG. 4, packaged with a flip-chip technique and used to process a signal from an antenna FIG. 6 schematically illustrates the integrated circuit die of FIG. 4, packaged with a wire-bond technique and used to process a signal from an antenna FIG. 7 schematically illustrates an integrated circuit die according to a non-limited embodiment of the invention FIG. 8 schematically illustrates the integrated circuit die of FIG. 7 that was packaged with a wire-bond technique and is used to process a signal from an antenna.
Figure 5:
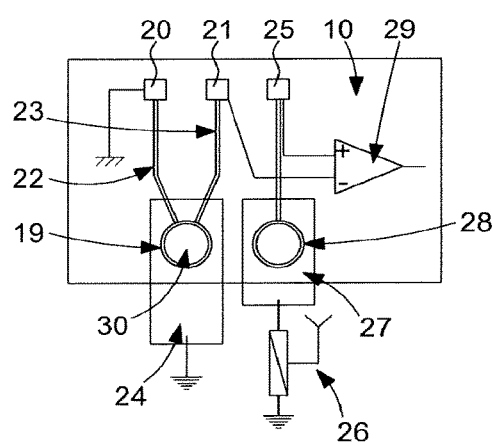
Figure 7:
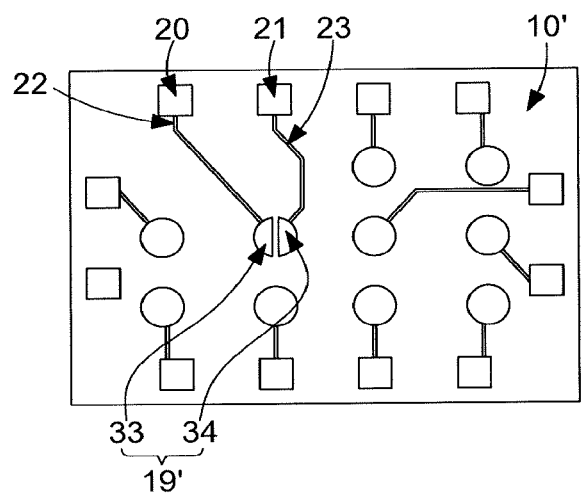

FIG. 7 shows an integrated circuit die 10' similar to the integrated circuit die 10 of FIG. 4, with the difference that the solder pad 19' linked to the VSS bond pad 20 and the AVSS bond pad 21 via the redistribution wires 22, 23 is split in half. More precisely, the solder pad 19' comprises a first portion 33 and a second portion 34 facing each other, each having a shape of a demi-disk. The first portion 33 is connected to the VSS bond pad 20 via the redistribution wire 22, and the second portion 34 is connected to the AVSS bond pad 21 via the redistribution wire 23. When no solder ball is placed onto the solder pad 19', the first portion 33 and the second portion 34 are not in electrical contact with each other. However, when a solder ball is placed onto the solder pad 19', the first portion 33 and the second portion 34 become in electrical contact with each other.

Figure 6:
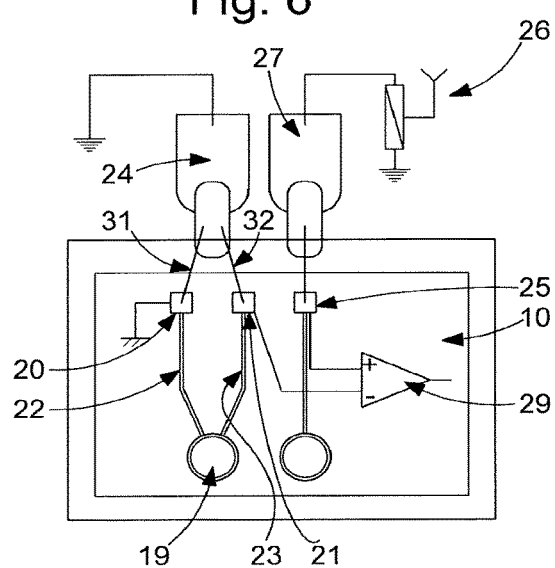
Figure 8:
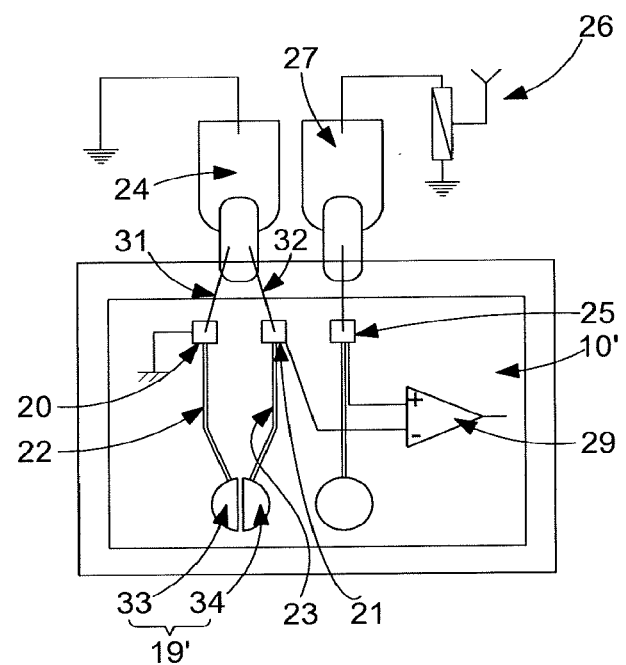

The key feature of the invention is that the electrical connections between the bond pads linked to the different portions are different depending on whether a solder ball is placed on the solder pad 19' or not. As a consequence, as illustrated in FIG. 8, when the die 10' is packaged with wire-bonds and used in the circuit previously detailed in reference to FIG. 6, there is no electrical connection between the AVSS bond pad 21 and the VSS bond pad 20 via the redistribution layer, hence no noise transmission from the digital ground to the analog ground.

Naturally, the portions 33, 34 may have another shape or be laid out differently on the die 10', as long as a single solder ball can establish an electrical contact between them.

What is claimed is:

1. An integrated circuit die comprising:
   at least two bond pads
   a redistribution layer, said redistribution layer comprising:
     at least one solder pad comprising two portions arranged to enable an electrical connection between each other by a same solder ball placed on said solder pad, but electrically isolated from each other in the absence of a solder ball on the solder pad,
     at least two redistribution wires, each one connecting one of the two portions to one of the two bond pads, a first bond pad connected via a first redistribution wire to a first portion of the solder pad being dedicated to digital ground and a second bond pad connected via a second redistribution wire to a second portion of the solder pad being dedicated to analog ground.

2. The integrated circuit die according to claim 1, wherein the portions have a shape of a demi-disk.

3. An electronic system comprising:
   an integrated circuit die according to claim 1,
   a grounded printed circuit board track connected to the first bond pad via a first bond-wire and to the second bond pad via a second bond wire.

4. An electronic system comprising:
   an integrated circuit die according to claim 1, and
   a grounded printed circuit board track, a solder ball being placed between the solder pad and the grounded printed circuit board track.

5. The electronic system according to claim 4, wherein the portions have a shape of a demi-disk.

6. An integrated circuit comprising:
   at least two bond pads;
   at least one solder pad comprising two portions arranged to enable an electrical connection between each other by a same solder ball placed on the solder pad, but electrically isolated from each other in the absence of a solder ball on the solder pad;
   a first wire connecting a first one of the at least two bond pads to a first portion of the solder pad;
   a second wire connecting a second one of the at least two bond pads to a second portion of the solder pad;
   a circuit board with at least one wire bond contact;
   a third wire connected between the wire bond contact and the first one of the two bond pads; and
   a fourth wire connected between the wire bond contact and the second one of the two bond pads.

7. The integrated circuit according to claim 6, wherein the portions have a shape of a demi-disk.

8. The integrated circuit according to claim 6, wherein the wire bond contact is grounded.

9. The integrated circuit according to claim 6, comprising:
   the first one of the two bond pads being connected to digital ground; and
   the second one of the two bond pads being connected to analog ground.

\* \* \* \* \*